(12) United States Patent
Baran et al.

(10) Patent No.: US 11,714,276 B2
(45) Date of Patent: Aug. 1, 2023

(54) MICROELECTROMECHANICAL SYSTEM (MEMS) SCANNER HAVING A TORSIONAL BEAM FLEXURE WITH VARIABLE WIDTH

(71) Applicant: MICROSOFT TECHNOLOGY LICENSING, LLC, Redmond, WA (US)

(72) Inventors: Utku Baran, Mercer Island, WA (US); Xiao Chuan Ong, Bellevue, WA (US); Wyatt Owen Davis, Bothell, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 362 days.

(21) Appl. No.: 15/930,395

(22) Filed: May 12, 2020

(65) Prior Publication Data
US 2021/0356733 A1 Nov. 18, 2021

(51) Int. Cl.
*G02B 26/08* (2006.01)
*G02B 26/10* (2006.01)
*H10N 30/20* (2023.01)

(52) U.S. Cl.
CPC ......... *G02B 26/085* (2013.01); *G02B 26/101* (2013.01); *G02B 26/105* (2013.01);
(Continued)

(58) Field of Classification Search
CPC ................ G02B 26/085; G02B 26/101; G02B 26/105; G02B 26/0858; G02B 26/0816;
(Continued)

(56) References Cited

U.S. PATENT DOCUMENTS

| 6,672,732 B1 | 1/2004 | Niendorf et al. |
| 2014/0313557 A1 | 10/2014 | Brown et al. |
| 2015/0241196 A1* | 8/2015 | Gerson ............... G02B 26/0833 73/788 |

(Continued)

FOREIGN PATENT DOCUMENTS

| DE | 102006051197 A1 | 5/2008 |
| DE | 102018215528 A1 | 3/2020 |

(Continued)

OTHER PUBLICATIONS

Holmstrom, et al., "MEMS Laser Scanners: A Review", In Journal of Microelectromechanical Systems, vol. 23, Issue 2, Apr. 1, 2014, pp. 259-275.

(Continued)

*Primary Examiner* — Kimberly N. Kakalec
(74) *Attorney, Agent, or Firm* — Newport IP, LLC; Jacob P. Rohwer

(57) ABSTRACT

A microelectromechanical systems (MEMS) scanning device comprising a torsional beam flexure that has a variable width in relation to a rotational axis for a scanning mirror. The geometric properties of the torsional beam vary along the rotational axis to increase a desired mode of mechanical strain at a location where a strain sensor is operating within the MEMS scanning device to generate a feedback signal. The torsional beam flexure mechanically suspends the scanning mirror from a frame structure. During operation of the MEMS scanning device, actuators induce torsional deformation into the torsional beam flexure to cause rotation of the scanning mirror about the rotational axis. The degree or amount of this torsional deformation is directly related to the angular position of the scanning mirror and, therefore, the desired mode of mechanical strain may be this torsional deformation strain component.

19 Claims, 6 Drawing Sheets

(52) U.S. Cl.
CPC ...... *H10N 30/2041* (2023.02); *B81B 2201/02* (2013.01); *B81B 2201/042* (2013.01)

(58) Field of Classification Search
CPC ............. G02B 26/0833–0866; B81B 2201/02; B81B 2201/042; B81B 2203/0154; B81B 2203/056; B81B 2203/06
See application file for complete search history.

(56) References Cited

U.S. PATENT DOCUMENTS

| | | |
|---|---|---|
| 2018/0210190 A1 | 7/2018 | Okada |
| 2019/0196176 A1 | 6/2019 | Yamada |
| 2020/0241286 A1* | 7/2020 | Ishida .................... B81B 3/00 |

FOREIGN PATENT DOCUMENTS

| | | |
|---|---|---|
| JP | 2005177876 A | 7/2005 |
| JP | 2012237788 A | 12/2012 |
| WO | 2019087919 A1 | 5/2019 |

OTHER PUBLICATIONS

Lee, et al., "LIDAR System using Indirect Time of Flight Method and MEMS Scanner for Distance Measurement", In Proceedings of the International Conference on Optical MEMS and Nanophotonics, Jul. 31, 2016, 2 Pages.

"International Search Report and Written Opinion Issued in PCT Application No. PCT/US21/028049", dated Jul. 26, 2021, 17 Pages.

* cited by examiner

MICROELECTROMECHANICAL SYSTEM (MEMS) SCANNER HAVING A TORSIONAL BEAM FLEXURE WITH VARIABLE WIDTH

BACKGROUND

Microelectromechanical systems (MEMS) scanning devices modulate a position of a scanning mirror by applying a drive signal to actuators that are mechanically coupled to the scanning mirror. Strain sensors are commonly used in MEMS scanning devices for sensing the angular position of the scanning mirror. In particular, a strain sensor may be positioned on a support structure such as a torsional beam flexure which suspends the scanning mirror in relation to a frame. This type of configuration ensures that the angular position of the scanning mirror is directly related to the amount of mechanical strain that the strain sensor undergoes. Thus, a strain reading provided by the strain sensor may be utilized by a controller as a feedback signal for continually correcting the drive signal to improve the accuracy with which the angular position of the scanning mirror is modulated. The strain sensor will ideally produce a feedback signal that is highly responsive to a component of strain that correlates to the angular position of the scanning mirror (e.g., torsional deformation of a torsional beam flexure supporting the scanning mirror). In real-world applications, the strain sensor may experience various modes of mechanical strain which occur for a variety of reasons such as bending deformation or vibrations and which may introduce "noise" into the feedback signal.

Therefore, an important design consideration for MEMS scanning devices is positioning the strain sensor that will provide the feedback signal. Specifically, it is desirable to position the strain sensor where it will be subjected to sufficient amounts of mechanical strain of the relevant mode such that the signal-to-noise ratio of the feedback signal remains high. For example, in configurations in which a scanning mirror is supported by a torsional beam flexure, the strain sensor should positioned on or near the torsional beam flexure at some location where the mechanical strain that relates to the angular position of the scanning mirror is adequate (e.g., where the torsional deformation is sufficiently high). The extremely small size of the support structures that support scanning mirrors may severely limit positions at which a strain sensor may be located. Unfortunately, in some designs the locations available for practical sensor placement experience inadequate mechanical strains of a desired mode (e.g., mechanical strain that result from and/or are directly related to the position of the scanning mirror).

It is with respect to these and other considerations that the disclosure made herein is presented.

SUMMARY

Technologies described herein provide a microelectromechanical systems (MEMS) scanning device comprising a torsional beam flexure that has a variable width in relation to a rotational axis for a scanning mirror. Generally described, the techniques disclosed herein facilitate increasing a desired mode of mechanical strain at a location where a strain sensor is operating within the MEMS scanning device to generate a feedback signal. The torsional beam flexure mechanically suspends the scanning mirror from a frame structure. During operation of the MEMS scanning device, actuators induce torsional deformation into the torsional beam flexure to cause rotation of the scanning mirror about the rotational axis. The degree or amount of this torsional deformation is directly related to the angular position of the scanning mirror and, therefore, the desired mode of mechanical strain may be this torsional deformation strain component.

As described in detail below, the geometric cross-sectional area properties of the torsional beam flexure may vary along the rotational axis to induce a sufficient amount of the desired mode of mechanical strain to occur near a frame mounting location where a strain sensor is placed. For example, the torsional beam flexure may include a first region having a first average width relative to the rotational axis and a second region having a second average width relative to the rotational axis. The first average width may be less than the second average width such that particular degrees of rotation of the scanning mirror correspond to relatively higher mechanical strains being induced into the first region as compared to the second region. The torsional beam flexure may be oriented with the first region proximate to the frame structure and distal from the scanning mirror whereas the second region is distal from the frame structure and proximate to the scanning mirror. In this way, electrical pathways routed via the frame structure can be readily connected to a stain sensor that is located within (or close to) the first region. Locating the strain sensor where mechanical strains are relatively high ensures that a high proportion of the mechanical strain induced into the strain sensor is directly related to the position of the scanning mirror and, therefore, that the feedback signal has a high enough signal-to-noise ratio to be useful for adjusting the drive signal.

In an exemplary embodiment, the MEMS scanning device includes a pair of actuators that are positioned on opposite sides of the rotational axis and which are mechanically coupled to the scanning mirror. The actuators may be indirectly coupled to the scanning mirror by way of the torsional beam flexure. For example, the torsional beam flexure may include a first lever arm, that extends transverse in relation to the rotational axis, and a second lever arm that also extends transverse in relation to the rotational axis, but in an opposite direction as compared to the first lever arm. The first lever arm may be coupled to a first actuator on a first side of the rotational axis and the second lever arm may be coupled to a second actuator on a second side of the rotational axis. In some embodiments, both of the actuators and the torsional beam flexure may be mechanically coupled to the frame structure.

Activation of the first actuator and second actuator, via drive signals provided by a controller, causes forces to be exerted against the first lever arm and the second lever arm, respectively. These forces result in a moment being applied to the torsional beam flexure which causes some degree of torsional deformation to the torsional beam flexure. Since the scanning mirror is suspended from the frame structure via the torsional beam flexure, activation of the actuators results in some degree of angular rotation of the scanning mirror (about the rotational axis and in relation to the frame structure) that is commensurate with the degree of torsional deformation to the torsional beam flexure. Furthermore, since the torsional beam flexure is mechanically coupled to the frame structure (which is relatively more stiff and resistant to deformation than the torsional beam flexure), the torsional deformation will include some amount of mechanical strain occurring within the torsional beam flexure proximate to the frame mounting location. As this is the desired mode of mechanical strain for the stain sensor to detect, the geometric properties of the torsional beam flexure may be varied along the rotational axis to maximize this desired mode of mechanical strain proximate to the frame mounting location.

To accomplish this objective, the torsional beam flexure may be oriented such that the first region having the first average width is located proximate to the frame mounting location whereas the second region having the second (and relatively larger) average width is located proximate to the scanning mirror. For example, the torsional beam flexure may be mounted to the frame structure at the first region and the scanning mirror may be mounted to the torsional beam flexure at the second region—thereby suspending the scanning mirror from the frame structure by way of the torsional beam flexure. Due to mechanics of materials principles, even though the first region and second region may be subjected to a similar or identical moment of force via the actuators, the relative widths of the first region and the second region may contribute to relatively higher mechanical strains being induced into the first region as compared to the second region at discrete degrees of rotation. For example, the relatively larger average width of the second region may result in second "area moment of inertia" $J_2$ for the second region that is greater than a first "area moment of inertia" $J_1$ for the first region. Unless explicitly stated otherwise, any discussion of an area moment of inertia (also referred to herein as simply "moment of inertia") refers to a geometric property of a cross-sectional area that reflects how the points making up that cross-sectional area are distributed with regard to the rotational axis (e.g., of the torsional beam flexure and/or scanning mirror).

A strain sensitive electrical circuit of the strain sensor may be located within (or near) the first region of the torsional beam flexure which is located proximate to the frame structure and which experiences high strain of the desired mode. An exemplary such strain sensor may be a piezoresistive (PZR) strain sensor comprised of multiple PZR elements that are arranged to form a bridge circuit (e.g., a Wheatstone bridge). The bridge circuit arrangement may include multiple PZR elements that are electrically coupled to one or more adjacent PZR elements via nodes. Individual ones of these nodes may be coupled to electrically conductive pathways (e.g., wire traces) that are embedded within and/or laid on top of the frame structure. An input signal (or bias voltage) VIN may be applied across one pair of the nodes to generate an output signal $V_{OUT}$ across another pair of the nodes. The output signal $V_{OUT}$ varies in proportion to the mechanical strain (including the torsional deformation) applied to the bridge circuit arrangement.

An object of the presently disclosed technologies is to optimize (e.g., maximize or otherwise ensure a sufficient amount of) the proportion of mechanical strain induced into a strain sensor that is directly related to the angular position of the scanning mirror. Specifically, the strain sensor being located where mechanical strains that relate to the angular position of the scanning mirror are relatively high is an important design consideration for ensuring that the feedback signal has a high enough signal-to-noise ratio to be useful for adjusting the drive signal. Furthermore, due to the extremely small size of torsional beam flexures in modern MEMS scanning devices (e.g., a torsional beam flexure may have element widths on the order of 10 microns), it may be impractical to locate a strain sensor at regions of the torsional beam flexure that are distal from a frame mounting location. For example, electrically coupling a controller to a strain sensor that is located distal from a frame mounting location may be infeasible since electrical traces cannot be reliably routed over the extremely small beam elements of a modern torsional beam flexure. Thus, some embodiments described herein include a torsional beam flexure that is designed with varying cross-sectional area properties to induce a relatively high degree of mechanical strain at a first region that is proximate to a frame mounting location—as compared to a second region that is proximate to the scanning mirror. As described in more detail below, this relatively high degree of mechanical strain may result from the first region having a moment of inertia "J" that is relatively lower than that of the second region.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

Figure 5:
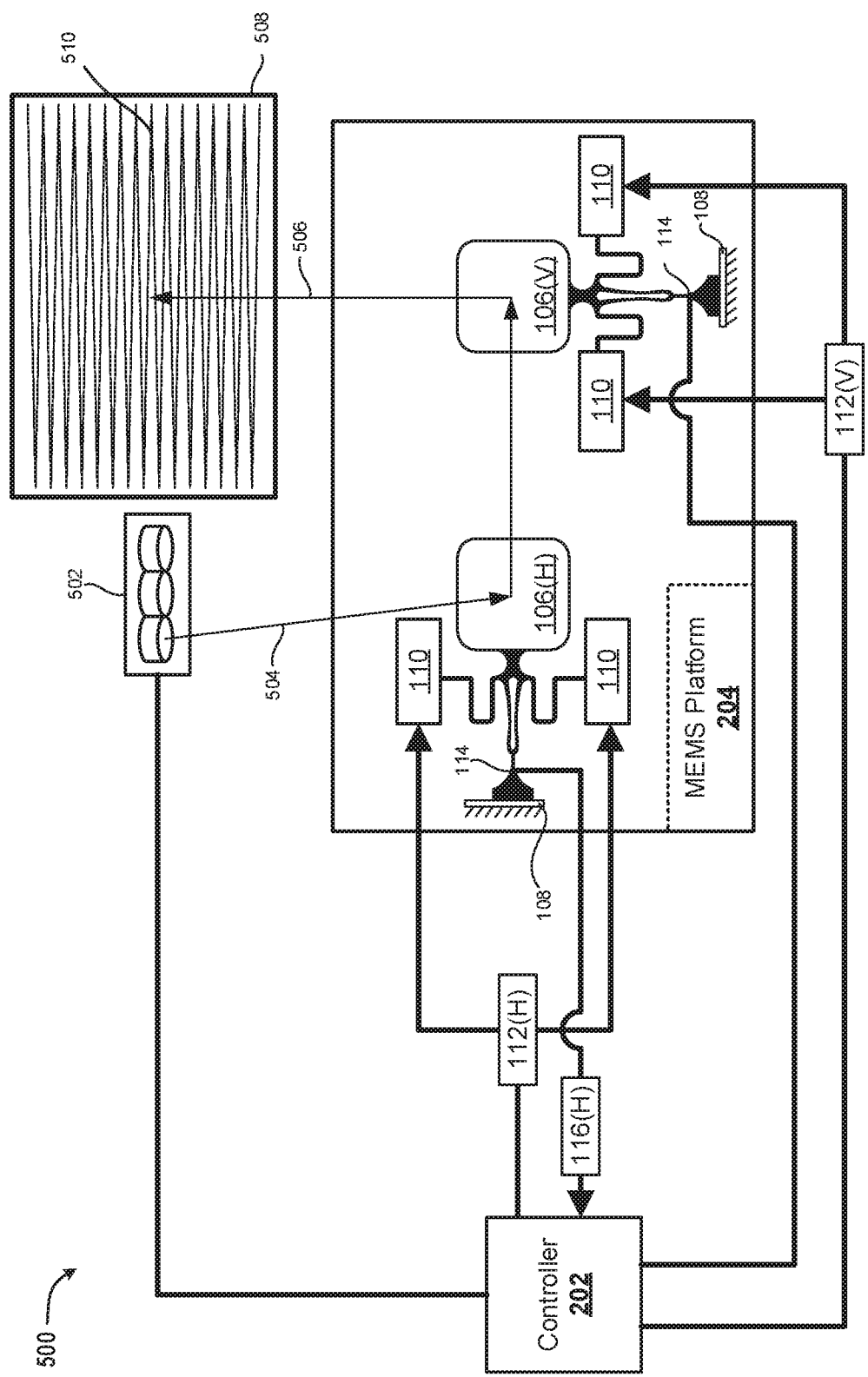

FIG. 5 illustrated is an exemplary scanned beam display system in which various embodiments of the MEMS platform described herein may be deployed.

DETAILED DESCRIPTION

This Detailed Description describes a microelectromechanical systems (MEMS) scanning device comprising a torsional beam flexure that has a variable width in relation to a rotational axis for a scanning mirror. The variable width geometry results in a location on the torsional beam flexure at which a strain sensor is positioned experiencing sufficient amounts of a desired mode of mechanical strain (e.g., strain that directly correlates to an angular position of the scanning mirror) so as to be useful as a feedback signal. In exemplary embodiments, the torsional beam flexure mechanically suspends the scanning mirror from a frame structure and actuators induce rotation of the scanning mirror about the rotational axis. As the scanning mirror rotates, a component of the mechanical strain induced into the torsional beam flexure is torsional deformation that is directly related to the angular position of the scanning mirror. The torsional beam flexure includes varying cross-sectional geometries which result in different area moments of inertia at different regions. For example, the torsional beam flexure may include a first region having a first average width and a second region having a second average width that is greater than the first average width.

Generally, the moment of inertia for a particular cross-sectional area increases along with average width. Thus, the first region may have a first moment of inertia $J_1$ and the second region may have a second moment of inertia $J_2$ that is greater than the first moment of inertia $J_1$. Due to the first moment of inertia $J_1$ being relatively less than the second moment of inertia $J_2$, torsional deformation caused by the actuators results in a greater amount of mechanical strain within the first region than in the second region. Furthermore, the first region of the torsional beam flexure may be located proximate to the frame structure and a strain sensitive electrical circuit may be located within (or close to) the first region. Thus, electrical pathways routed via the frame structure can be readily connected to nodes of the strain sensitive electrical circuit. An object of the disclosed techniques is to facilitate locating a strain sensitive electrical circuit (of a strain sensor) where a high proportion of the induced mechanical strain is directly related to the angular position of the scanning mirror. In this way, the feedback signal produced by the strain sensor will have a sufficiently high signal-to-noise ratio to be useful for adjusting a drive signal controlling the actuators.

The techniques disclosed herein are widely applicable to a variety of approaches for modulating geometric properties of a support element to optimize an amount of a desired mode of mechanical strain induced into a location of the support element that is practical and/or ideal for locating a strain sensor. Numerous aspects of the techniques disclosed herein are described in the specific context of modulating an average width of a torsional beam flexure to ensure that a sufficient amount and proportion of mechanical strain that a strain sensor undergoes is directly related to an angular position of a scanning mirror about a rotational axis. While the presently disclosed techniques are not necessarily limited to such embodiments, an appreciation of various aspects of the techniques disclosed herein is readily gained through a discussion of examples in this specific context of microelectromechanical systems (MEMS) scanning devices. However, the disclosed techniques are applicable to modulating geometric properties of a variety of beam elements to control an amount of strain induced into a strain sensitive electrical circuit.

Figure 1:
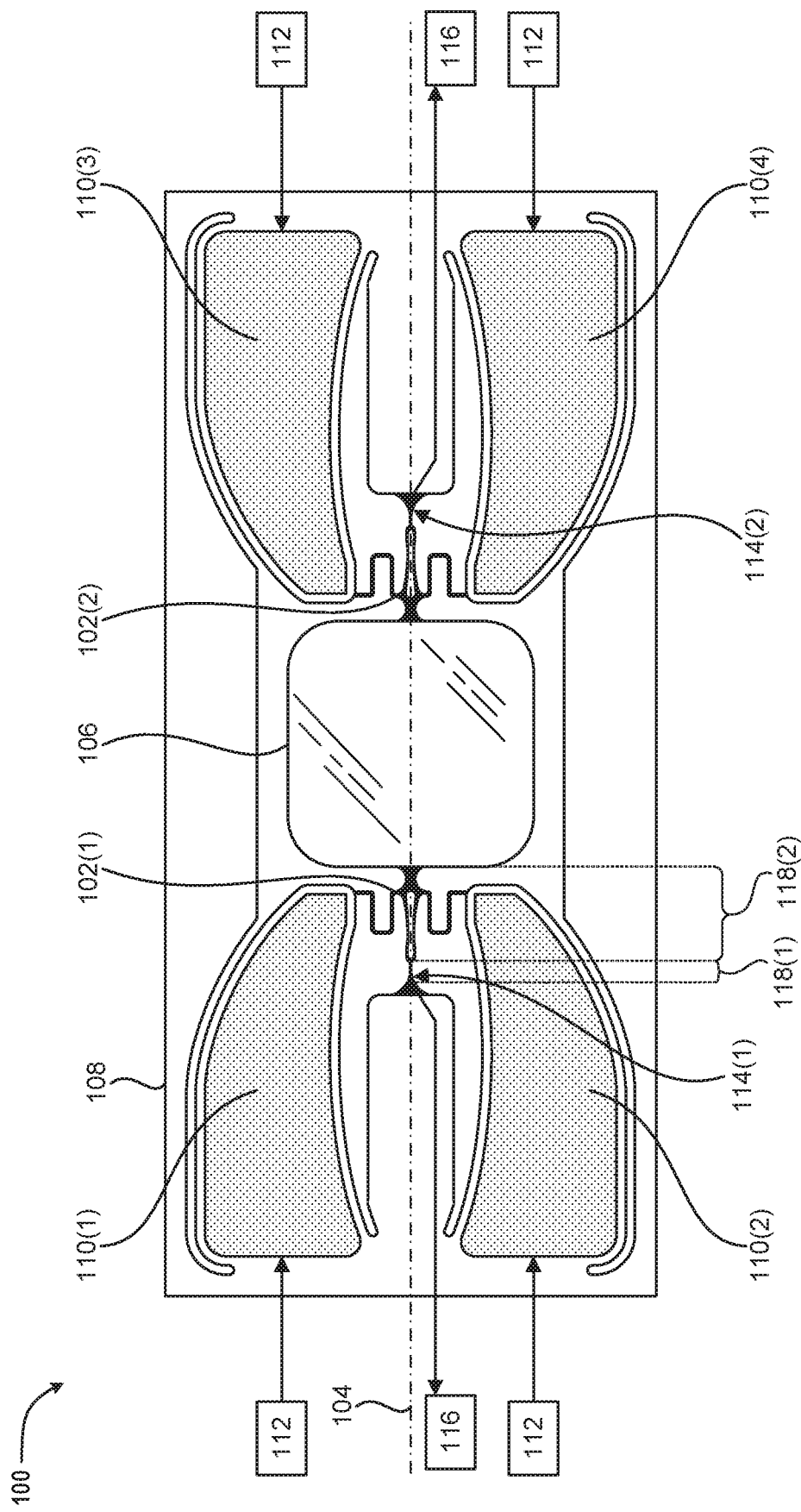
FIG. 1 illustrates an exemplary microelectromechanical systems (MEMS) scanning device having a pair of torsional beam flexures that each have a variable width in relation to a rotational axis for a scanning mirror.

Turning now to FIG. 1, illustrated is an exemplary microelectromechanical systems (MEMS) scanning device 100 (also referred to herein as MEMS scanner) having a pair of torsional beam flexures 102 that each have a variable width in relation to a rotational axis 104 for a scanning mirror 106. As illustrated, the scanning mirror 106 is suspended from a frame structure 108 by way of a first torsional beam flexure 102(1) and a second torsional beam flexure 102(2). The MEMS scanning device 100 includes two pairs of actuators 110, each actuator pair corresponding to an individual one of the torsional beam flexures 102. For example, as illustrated in FIG. 1, the first torsional beam flexure 102(1) is mechanically coupled to both of a first actuator 110(1) and a second actuator 110(2) by way of lever arms that extend transverse in relation to the rotational axis 104. Similarly, the second torsional beam flexure 102(2) is mechanically coupled to both of a third actuator 110(3) and a fourth actuator 110(4), also by way of lever arms extending transverse in relation to the rotational axis 104. For illustrative purposes, the torsional beam flexures 102 (including the lever arms thereof) as illustrated in solid black to adequately demark transitions between the torsional beam flexures 102 and the other system components (e.g., the scanning mirror 106, the frame 108, and the actuators 110). It will be appreciated by one skilled in the art of MEMS actuator design that the torsional beam flexures 102 may be coupled to the scanning mirror 106, the actuators 110, and/or the frame 108 by via a layer of silicon film that is common to and continuous between the torsional beam flexures 102 and the other system components. For example, the actuators 110 may each include a thin (e.g., three micron "3 μm") layer of lead zirconate titanate (PZT)—a material that shows a marked piezoelectric effect.

Drive signals 112 may be provided to the cause the first actuator 110(1) and the second actuator 110(2) to actuate (e.g., change shape) in unison thereby inducing a moment of force upon the first torsional beam flexure 102(1). The moment forces generated by each actuator may be in the same direction (e.g., clockwise or counterclockwise) about the rotational axis 104. At the same time, additional drive signals 112 may also be provided to cause the third actuator 110(3) and the fourth actuator 110(4) to actuate in unison to induce an additional moment of force upon the second torsional beam flexure 102(2). These moments of force ultimately result in some degree of torsional deformation being induced into the first torsional beam flexure 102(1) and/or the second torsional beam flexure 102(2).

Since the scanning mirror 106 is suspended from the frame structure 108 via the torsional beam flexures 102, causing torsional deformation to the torsional beam flexures 102 results in some degree of angular rotation of the scanning mirror 106 about the rotational axis 104. Thus, activation of the actuators 110 via the drive signals 112 causes the scanning mirror 106 to rotate about the rotational axis 104 in relation to the frame structure 108. The degree of torsional deformation to the torsional beam flexures 102 is commensurate with the angular position of the scanning mirror 106. Due to the torsional beam flexures 102 each being mechanically coupled to the frame structure 108 (which is relatively more stiff and resistant to deformation than the torsional beam flexures 102), some component of mechanical strain that occurs within the torsional beam flexures 102 proximate to a frame mounting location will be a direct result of this torsional deformation. It will be further appreciated that accurately measuring this component of the mechanical strain (i.e., the desired mode of mechanical strain) is important in providing a suitable feedback signal.

To measure the desired mode of mechanical strain, the MEMS scanning device 100 further comprises strain sensors 114 for providing a feedback signal 116 to a controller (shown in FIG. 2) that is generating the drive signals 112. For purposes of FIG. 1, the location of the strain sensors 114 is identified but specific details of the stain sensor 114 are omitted due to the drawing scale size; however, details of the stain sensor 114 are illustrated in FIG. 3. An exemplary strain sensor 114 may be a piezoresistive (PZR) strain sensor that is comprised of multiple PZR elements arranged in a bridge circuit arrangement (e.g., a Wheatstone bridge) to form a strain sensitive electrical circuit. The bridge circuit arrangement may include one or more PZR elements that are electrically coupled to the controller and that generate an output signal $V_{OUT}$ that varies in proportion to the mechanical strain (including the torsional deformation) applied to the bridge circuit arrangement. Thus, the feedback signal 116 is indicative of the true angular position of the scanning mirror 106. The controller may use the feedback signal 116 for continually correcting the drive signals 112 so as to improve the accuracy with which the angular position of the scanning mirror is modulated.

As described above, an important design consideration for MEMS scanners is positioning strain sensors where sufficient amounts of a desired mode of mechanical strain will occur so as to continuously and accurately indicate the angular position of the scanning mirror. This is because positioning strain sensors in this manner will ensure that the signal-to-noise ratio of the feedback signal 116 remains high. To achieve this important design consideration, in some embodiments, the torsional beam flexures 102 may have geometric properties that vary across different regions 118 so that the desired mode of mechanical strain (e.g., within the torsional beam flexures 102) is the highest within a region that is proximate to the frame structure 108. For example, as illustrated, the first torsional beam flexure 102(1) includes a first region 118(1) having a first average width and a second region 118(2) having a second average width. Although specific dimensions are not provided, the relative scale of the first region 118(1) and the second region 118(2) as drawn in FIG. 1 shows that the average width of the first region 118(1) may be less than the average width of the second region 118(2). As another specific but non-limiting example, the average width of the first region 118(1) may be less than 50 microns (50 µm) whereas the second average width of the second region 118(2) may be at least three times greater than the first average width. Furthermore, as illustrated, the first torsional beam flexure 102(1) is oriented such that the first region 118(1) is proximate to the frame structure 108 and the second region 118(2) is proximate to the scanning mirror 106.

The varying geometric properties (including but not limited to the variations in average width along the rotational axis) of the torsional beam flexure 102 result in the first region 118(1) having a first polar moment of inertia $J_1$ and the second region 118(2) having a second polar moment of inertia $J_2$. Furthermore, the first polar moment of inertia $J_1$ may be less than the second polar moment of inertia $J_2$ due, in part, to the average width of the second region 118(2) being greater than the average width of the first region 118(1). The polar moment of inertia J for any given cross-sectional area, A, of the torsional beam flexure 102 can be determined based on the equation 1 as follows:

$$J=\int_A r^2 dA \qquad \text{Equation 1.}$$

where r is the distance to the element dA. Note that the polar moment of inertia J is a geometric property of the given cross-sectional area and is always positive. Common units used for measurement of the polar moment of inertia J is $mm^4$ or $in^4$. Generally speaking, the greater the polar moment of inertia J for a cross-sectional area the less mechanical strain will result from that cross-sectional area being subjected to a particular torque. Since the internal torque T within the torsional beam flexure 102 will be constant between the frame structure 108 and where the force from the actuators is applied via the lever arms, the modulation of the geometric properties to cause the first polar moment of inertia $J_1$ to be less than the second polar moment of inertia $J_2$ may result in the mechanical strain being greater within the first region 118(1) as compared to the second region 118(2). It will be appreciated by one skilled in the art of actuator design and mechanics of materials, that the resultant internal torque T acting at any particular cross-section and/or region is determinable using the method of sections and the equation of moment equilibrium applied about the rotational axis 104.

In this way, the geometric cross-sectional properties of the torsional beam flexure 102 vary at different regions along the rotational axis 104 to optimize (e.g., maximize or otherwise increase) a desired mode of mechanical strain that is induced into a strain sensor 114. For example, as described in relation to FIG. 1, by varying the cross-sectional properties so that the torsional beam flexure 102 has a relatively high moment of inertia within some region that is distal from the frame structure 108 as compared to some other region that is proximate to the frame structure 108, the strain sensor 114 can be located within the MEMS scanning device 100 within a region of the torsional beam flexure 102 that (during operation of the MEMS scanning device 100) is both: (i) subjected to a sufficiently high amount of a desired strain to retain a high signal-to-noise ratio of the feedback signal 116; and (ii) practical for electrically coupling the strain sensor 114 to a controller. For purposes of the present disclosure, references to a moment of inertia of a particular cross-sectional area refers specifically to a value that is determinable based on equation 1 above. References to a moment of inertia of a particular region (e.g., some length along the rotational axis) of the torsional beam flexure 102 refers to a moment of inertia integrated along that particular length. For example, the polar moment of inertia for a region of the torsional beam flexure extending along the rotational axis from 0 to L can be determined based on the equation 2 as follows:

$$J=\int_0^L J(x)dx \qquad \text{Equation 2.}$$

where J(x) is the polar moment of inertia of the torsional beam flexure expressed as a function of position x along the rotational axis.

Figure 2:
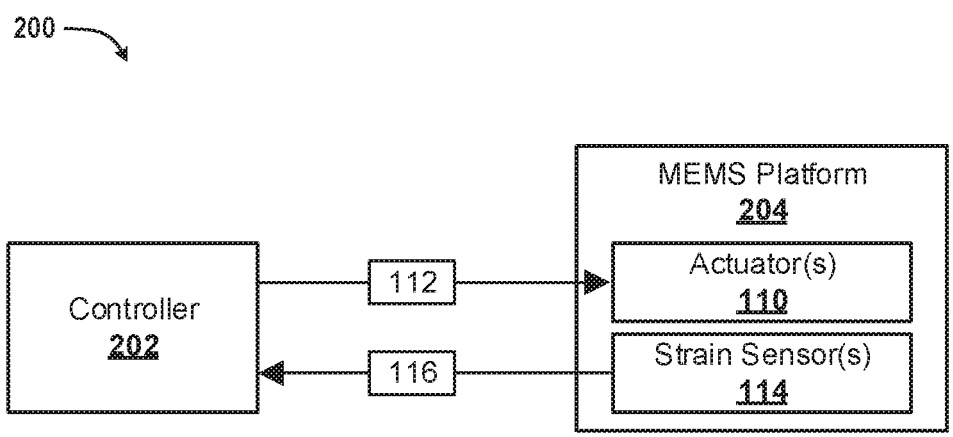
FIG. 2 illustrates a block diagram of an exemplary control system for a microelectromechanical system (MEMS) platform.
Figure 3:
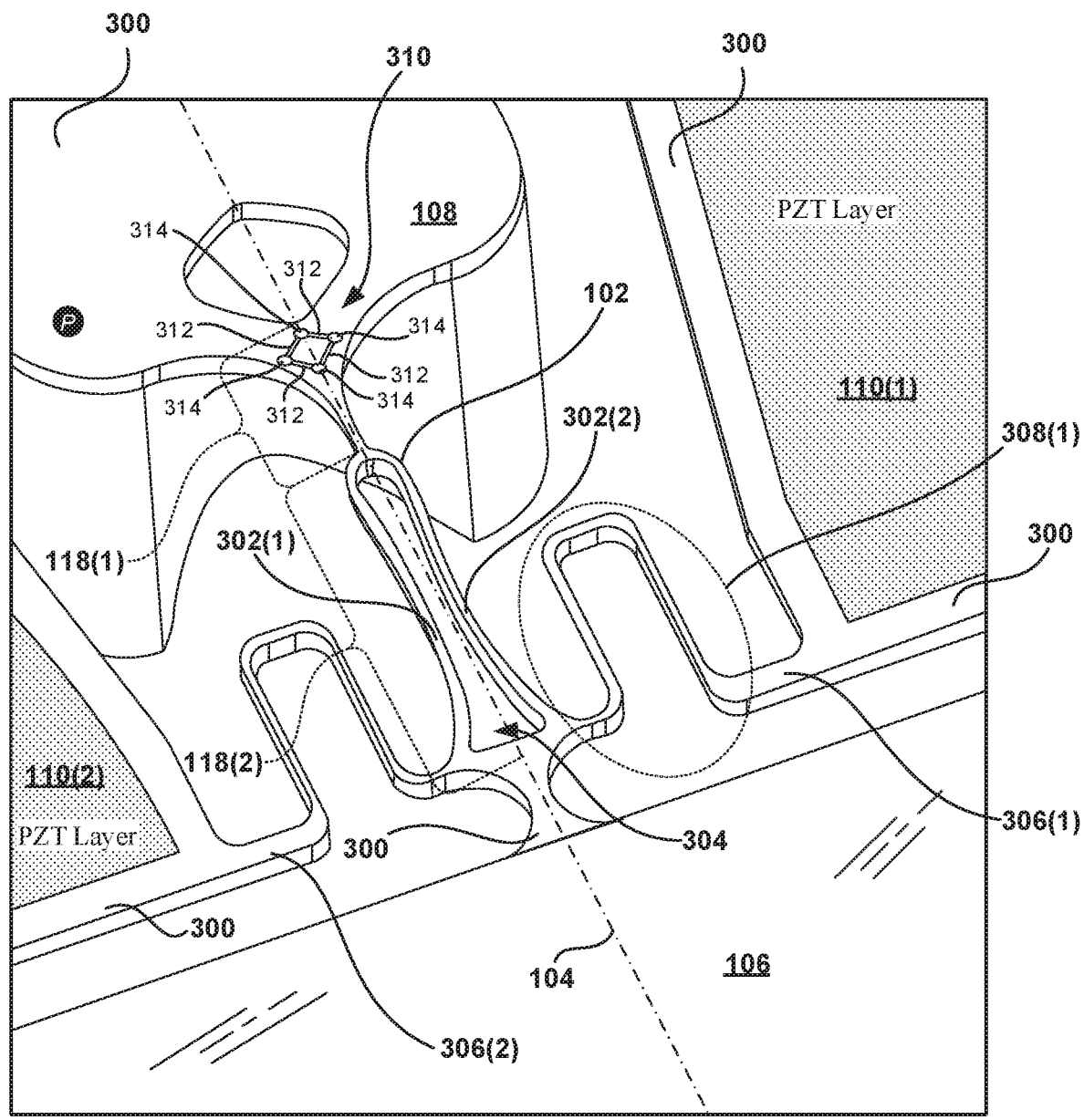
FIG. 3 illustrates an exemplary torsional beam flexure that is interconnected to both a frame and a scanning mirror along a rotational axis and that includes a void that is formed between two physically separated beam elements.

Turning now to FIG. 2, illustrated is a block diagram of an exemplary control system 200 for the microelectromechanical system (MEMS) platform 204. As illustrated in FIG. 2, the control system 200 may include a controller 202 that provides drive signals 112 to one or more actuators 110 of the MEMS platform 204. As further illustrated, the control system 200 further includes strain sensors 114 that detect certain modes of mechanical strain within the MEMS platform 204 and, in response thereto, provide a feedback signal 116 to the controller 202. As discussed further herein, an exemplary strain sensor 114 may comprise a piezoresistive (PZR) sensor that transduces mechanical movement of a specific portion of the MEMS platform 204 into an electrical signal to generate the feedback signal 116. In various embodiments, the MEMS platform 204 may be a component of a scanned beam display system as shown and described with respect to FIG. 5, below. However, the MEMS platform 204 may be any type of MEMS device that operates electromechanically in response to a drive signal 112 while returning a feedback signal 116 to facilitate periodic and/or continual refinement of the drive signal 112. Thus, although described predominantly in relation to a scanned beam display system, the scope of the claimed subject matter is not limited in this respect.

With particular reference to FIG. 3, in some embodiments, the torsional beam flexure 102 is formed of a plate 300 of selected material that extends continuously throughout one or more of the scanning mirror 106, the actuators 110, and the frame 108. For example, the scanning mirror 106 may correspond to a portion of thin (e.g., thirty-five micron "35 µm") plate of Silicon 100 which has some mirrored surface or film deposited thereon, the actuators 110 may correspond to a portion of this thin plate which has a thin (e.g., three micron "3 µm") layer of lead zirconate titanate (PZT) deposited thereon, and the frame 108 may correspond to some portion of the thin plate which is overlaid on/coupled to a substantially thicker plate (e.g., four-hundred micron "400 µm") of Silicon 100 to provide frame like rigidity. Due to the nature of the torsional beam flexure 102 being a continuous material, an important design consideration for the torsional beam flexure 102 is to provide sufficient mechanical compliance in relation to the stroke of the actuators 110 and the rotational throw of the scanning mirror 106.

FIG. 3 illustrates is an exemplary torsional beam flexure 102 that includes a void 304 that is formed between two physically separated beam elements 302 for the purpose of providing mechanical compliance. Specifically, the inclusion of the void 304 within the second region 118(2) of the torsional beam flexure 102 tends to increase the degree to which the torsional beam flexure 102 is able to undergo elastic deformation responsive to the mechanical forces that are applied via activation of the actuators 110. As illustrated, the torsional beam flexure 102 is interconnected to both of the frame 108 and to the scanning mirror 106 along a rotational axis 104. In the illustrated example, the torsional beam flexure 102 includes two beam elements 302 that are each located within the second region 118(2) that corresponds to some length along the rotational axis 104. However, in various other examples, the torsional beam flexure 102 may include three of more beam elements forming two of more voids. Each of the first beam element 302(1) and the second beam element 302(2) extend substantially longitudinal in relation to rotational axis 104. Furthermore, as illustrated, the first beam element 302(1) and the second beam element 302(2) are disposed on opposite sides of the rotational axis 104 such that the void 304 formed therebetween is coincident with the rotational axis 104 about which the scanning mirror 106 rotates.

In various embodiments, the void 104 formed between the beam elements 302 within the second region 118(2) has an "average" width that is greater than the first width of the first region 118(1). As a specific but non-limiting example, the average width of the first region 118(1) may be less than thirty microns (30 µm) whereas the average width of the void 304 formed within the second region 118(2) may be greater than sixty microns (60 µm). As another specific but non-limiting example, the average width of the first region 118(1) may be less than twenty microns (20 µm) whereas the average width of the void 304 may be greater than forty microns (40 µm). As another specific but non-limiting example, the average width of the first region 118(1) may be approximately 10 microns (20 µm) whereas the average width of the void 304 may be greater than twenty microns (40 µm).

As further illustrated, the torsional beam flexure 102 is mechanically coupled to a pair of actuators 110 via a pair of lever arms 306. In this way, each of the first actuator 110(1) and the second actuator 110(2) are indirectly coupled to the scanning mirror 106 via the second region 118(2) of the torsional beam flexure 102. For example, a first lever arm 306(1) extends transverse in relation to the rotational axis 104 to the first actuator 110(1) and the second lever arm 306(2) extends transverse in relation to the rotational axis 104 to the second actuator 110(2). In the illustrated example, the first actuator 110(1) is positioned directly opposite from the second actuator 110(2) in a symmetrical manner. However, in some examples, rotation is induced into the scanning mirror 104 by a single actuator 110. In some examples, rotation is induced into the scanning mirror 104 multiple actuators which are asymmetrically located with respect to the rotational axis 104.

In the illustrated example, each of the first lever arm 306(1) and the second lever arm 306(2) include a corresponding omega region 308, that extends at least partially longitudinal in relation to the rotational axis 104, for the purpose of providing mechanical compliance. Specifically, similar to the void 304, the inclusion of the omega region(s) 308 within the torsional beam flexure 102 tends to increase the degree to which the torsional beam flexure 102 is able to undergo elastic deformation responsive to the mechanical forces that are applied via activation of the actuators 110. To reduce illustrative clutter in FIG. 3, only a first omega region 308(1) that is formed within the first lever arm 306(1) is labeled. As illustrated from the rotational axis 104 to the first actuator, the first omega region 308(1) includes a first rounded transition at which the torsional beam flexure 102 changes from extending transverse in relation to the rotational axis 104 to extending relatively more longitudinal in relation to the rotational axis 104. Following this first rounded transition is a length of flexure which extends substantially parallel to the rotational axis and then a second rounded transition at which the torsional beam flexure again begins extending more transverse (e.g., substantially perpendicular to) to the rotational axis 104. Following this second rounded transition is a length of flexure which extends substantially perpendicular to the rotational axis and then a third rounded transition at which the torsional beam flexure again begins extending more longitudinal to the rotational axis 104. Finally, following this third rounded transition is a fourth rounded transition at which the flexure again turns and extends ultimately to the first actuator 110(1).

As illustrated, in some embodiments, the void 304 extends along the rotational axis 104 for a distance between the frame 108 and the scanning mirror 106. For purposes of the present discussion, the portion of the inner profile of the void 304 which is closest to the frame 108 and first region 118(1) (and furthest from the scanning mirror 106) is referred to as the void apex. Opposite the void apex, the portion of the inner profile of the void 304 which is furthest from the frame 108 and the first region 118(1) (and closest to the scanning mirror 106) is referred to as the void base. In the illustrated embodiments, the void base is wider and relatively flatter than the void apex. For example, a portion of the void apex may include a first inner radius and the void base may be include a second inner radius that is larger than the first inner radius.

In some embodiments, the flexible lever arms 308 extend transverse from a portion of the second region 118(2) that is closer to the void base than to the void apex. For example, as illustrated, the flexible lever arm 306 extends transverse from a portion of the second region 118(2) that is slightly below and/or in-line with (e.g., colinear with a best fit line of) the profile shape of the void base.

To measure the desired mode of mechanical strain, a first region 118(8) of the torsional beam flexure 102 may include a strain sensitive electrical circuit 310 that provides the feedback signal 116 to a controller (shown in FIG. 2) that is generating the drive signals 112. An exemplary strain sensitive electrical circuit 310 may be a piezoresistive (PZR) strain sensor that is comprised of multiple PZR elements arranged in a bridge circuit arrangement (e.g., a Wheatstone bridge). The bridge circuit arrangement may include multiple PZR elements 312 that are electrically coupled to one or more adjacent PZR elements via nodes 314. Individual ones of these nodes may be coupled to electrically conductive pathways (e.g., wire traces) that are embedded within and/or laid on top of the plate 310 and which extend over the frame structure 108.

An input signal (or bias voltage) VIN may be applied across one pair of the nodes 314 to generate an output signal $V_{OUT}$ across another pair of the nodes 314. The output signal $V_{OUT}$ varies in proportion to the mechanical strain (including the torsional deformation) applied to the bridge circuit arrangement. Thus, the feedback signal 116 is indicative of the true angular position of the scanning mirror 106. For example, individual ones of the strain sensors 114 may be oriented on individual torsional beam flexures 102 in a manner such that the component of mechanical strain that results from torsional deformation of the torsional beam flexures 102 can be accurately measured. For example, the strain sensors 114 may each include four PZR elements that are oriented at an approximately forty-five degrees (45°) angle with respect to the rotational axis 104. This particular orientation for the strain sensors 114 may maximize, or nearly maximize, the output signal generated by the strain sensors 114. The controller may use the feedback signal 116 for continually correcting the drive signals 112 so as to improve the accuracy with which the angular position of the scanning mirror is modulated.

As used herein, the term "closer" is used to denote a relative distance of two or more object from some other reference object. For example, as illustrated in FIG. 3, the strain sensitive electrical circuit 310 is disposed relatively closer to the first region 118(1) of the torsional beam flexure than to the second region 118(2) of the torsional beam flexure. For example, as illustrated, the strain sensitive electrical circuit 310 is disposed within the first region 118(1) and, therefore, inherently outside of the second region 118(2). Thus, as illustrated, the strain sensitive electrical circuit 310 can aptly be characterized as being closer to the first region 118(1) than the second region 118(2). To further illustrated this point, suppose that the strain sensitive electrical circuit 310 were instead located at the point P on the frame 108 that is labeled with a white P inside a black dot. In this case, the strain sensitive electrical circuit 310 would be located outside of both of the first region 118(1) and the second region 118(2) but would still be "relatively closer to" the first region 118(1) than (as compared to) the second region 118(2).

Figure 4A:
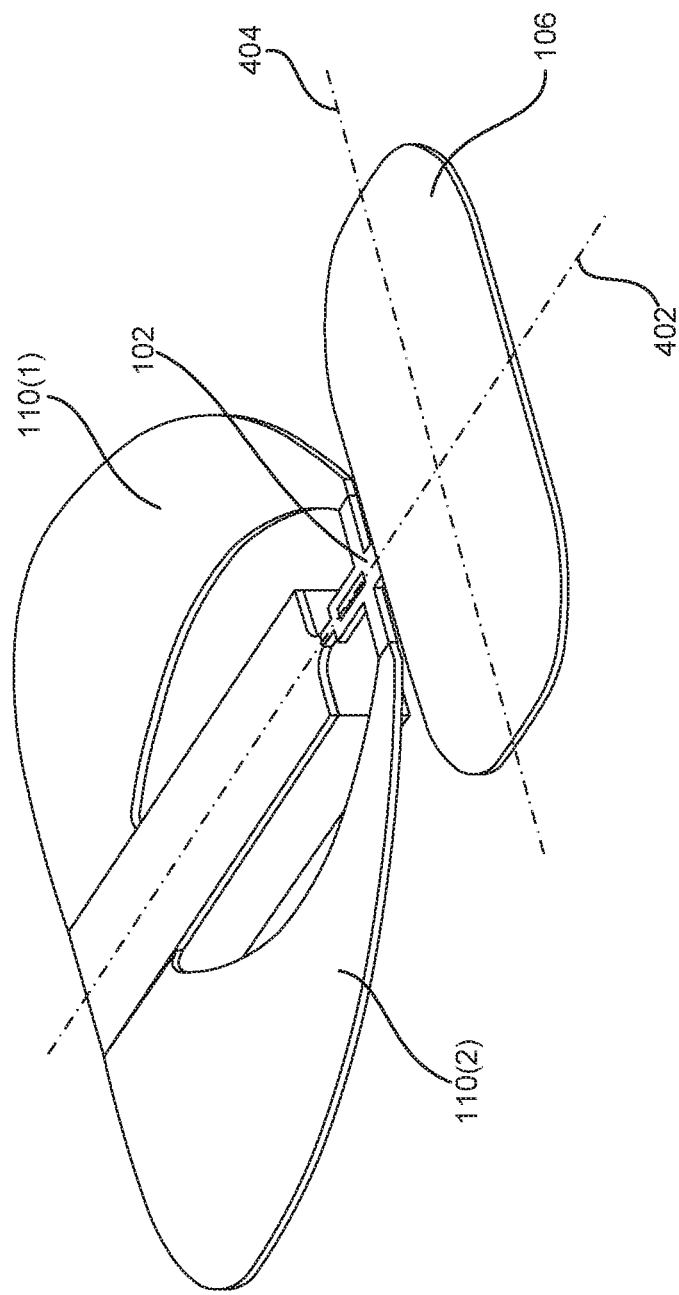
FIG. 4A illustrates a MEMS scanning device in a neutral state in which the actuators are in an equilibrium position and in which the scanning mirror is aligned with both of a longitudinal axis and lateral axis of the MEMS scanning device.
Figure 4B:
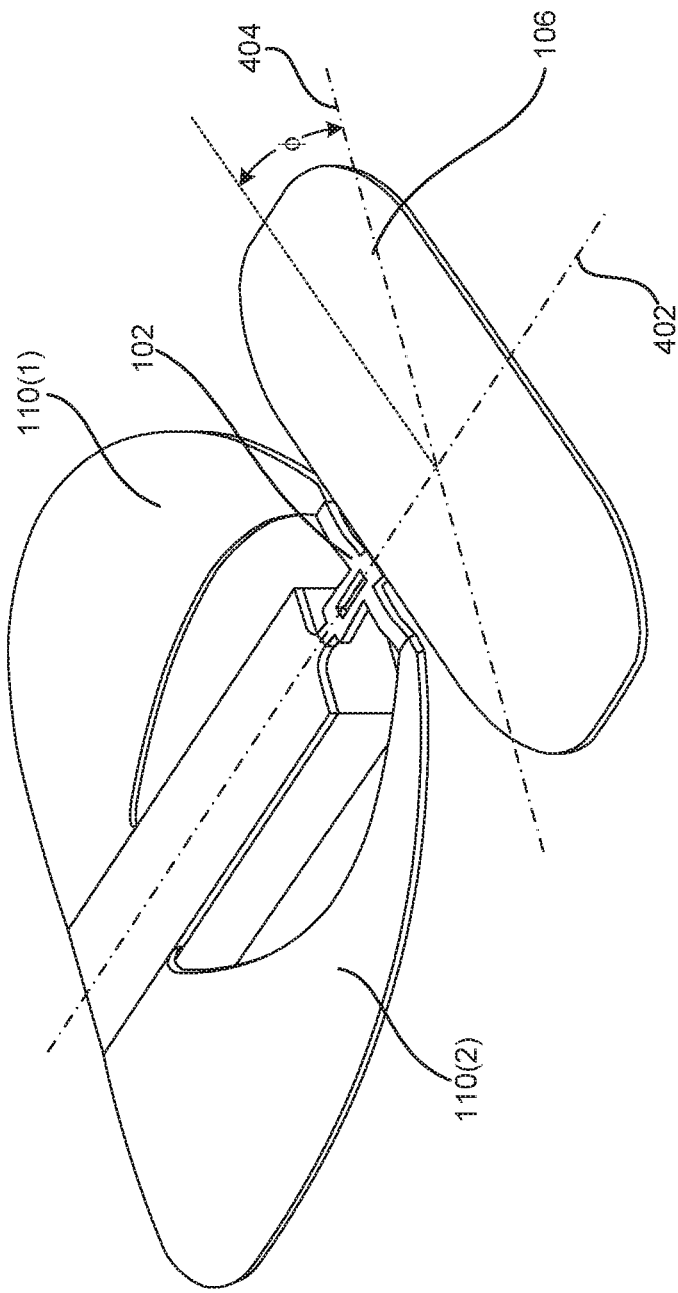
FIG. 4B illustrates the MEMS scanning device of FIG. 4A in a flexed state in which the actuators have been caused to induce rotation of the scanning mirror about the longitudinal axis.

FIGS. 4A and 4B illustrate various flexure states of an exemplary MEMS scanning device 100 in accordance with one or more embodiments described herein. In particular, as described herein, during operation of the MEMS scanning device 100, actuators 110 induce torsional deformation into the torsional beam flexure 102 to cause rotation of the scanning mirror 106 about the rotational axis 104. The degree or amount of this torsional deformation is a direct result of the amount of stoke the actuators 110 are deformed to. Also, the degree of amount of this torsional deformation is indicative of the angular position of the scanning mirror 106.

FIG. 4A illustrates the MEMS scanning device 100 in a neutral state in which the actuators 110 are in an equilibrium position in which the scanning mirror 106 is aligned with both of a longitudinal axis 402 and lateral axis 404 of the MEMS scanning device 100. The neutral state illustrated in FIG. 4A may correspond to a resting or equilibrium state in which no drive signal is currently being applied to the actuators 110. Although FIGS. 4A and 4B illustrate the scanning mirror 106 suspended from a single torsional beam flexure 102, it should be appreciated that the motion described in relation to FIGS. 4A and 4B is directly applicable to the embodiments described herein which include multiple torsional beam flexure 102 suspending the scanning mirror 106.

FIG. 4B illustrates the MEMS scanning device 100 in a flexed state in which the actuators 110 have been caused to induce rotation of the scanning mirror 106 about the longitudinal axis 402 (e.g., the rotational axis 104). For example, the controller 202 may apply drive signals 112 to the actuators 110. The drive signals 112 may be a voltage that generates an electrical field on a piezoelectric material of the actuators 110, thereby causing the point of the actuators that is coupled to the torsional beam flexure 102 to undergo some degree of stroke (e.g., movement along a desired design-path). As a result of this actuator stroke, a torsional force is applied to the torsional beam flexure 102 by way of the lever arms 306 causing the scanning mirror 106 to rotate about the longitudinal axis 402. As shown in FIG. 4B, the scanning mirror 106 may be rotationally displaced relative to a plane defined by the longitudinal axis 402 and a lateral axis 404 to a positive displacement angle ($\phi$).

Upon reaching the positive displacement angle ($\phi$), the drive signal 112 may be adjusted to drive the scanning mirror to a negative displacement angle ($\phi$). It will be appreciated by one skilled in the art of MEMS scanner design that during operation the drive signals 112 may be continually applied and adjusted to cause the scanning mirror 106 to oscillate at a desired frequency between the positive displacement angle ($\phi$) and the positive displacement angle ($\phi$).

Turning now to FIG. 5, illustrated is an exemplary scanned beam display system 500 in which various embodiments of the MEMS platform 204 described herein may be deployed. As illustrated, the scanned beam display system 500 may comprises a light engine 502 which may include one or more light sources capable of emitting one or more beams 504 of light toward one or more scanning mirrors 106. In some embodiments, the light engine 502 includes multiple laser light sources that are individually capable of emitting light of a particular wavelength and/or within a particular range of wavelengths. As illustrated, the beam(s) 504 of light are incident on the MEMS platform 204 and reflects on the one or more scanning mirrors 106. In the specifically illustrated but nonlimiting scenario, the MEMS platform 204 includes a horizontal scanning mirror 106(H) and a vertical scanning mirror 106(V). As illustrated, the beam(s) 504 are initially incident on the horizontal scanning mirror 106(H) and then the vertical scanning mirror 106(V) and then are ultimately as a controlled output beam 506 that is directed toward a display 506. In one or more alternative embodiments, the beam(s) 504 may initially be incident on the vertical scanning mirror 106(V), then reflected to the horizontal scanning mirror 106(H), and finally toward the display 508 in the form of the controlled output beam 508. In one or more alternate embodiments, a single scanning mirror 106 may scan the beam(s) 504 in both the horizontal and vertical directions.

In the illustrated embodiment, a horizontal drive signal 112(H) drives one or more actuators 110 whereas a vertical drive signal 112(V) drives one or more actuators 110, which may be different than those actuators 110 driven by the horizontal drive signal 112(H). Thus, by suppling the horizontal drive signal 112(H) and the vertical drive signal 112(V), the controller 202 causes the MEMS platform 204 to deflect the scanning mirror(s) 106 to cause output beam 506 to generate a biaxial scan 510, thereby creating a displayed image via the display 508. For example, the controller 202 may convert pixel information of an input image into laser modulation synchronous to the motion of MEMS platform 204 to write the image information as a displayed image based upon the position of the output beam 506 in a raster pattern and the corresponding intensity and/or color information at the corresponding pixel in the image.

Controller 122 may also control other various functions of scanned beam display system 500. In one or more embodiments, a horizontal axis may refer to the horizontal direction of biaxial scan 510 and the vertical axis may refer to the vertical direction of biaxial scan 510. Scanning mirror(s) 106 may sweep the output beam 506 horizontally at a relatively higher frequency and also vertically at a relatively lower frequency and with a constant velocity over a portion of the scan. The result is a scanned trajectory of laser beam 506 to result in biaxial scan 510. The fast and slow axes may also be interchanged such that the fast scan is in the vertical direction and the slow scan is in the horizontal direction. However, the scope of the claimed subject matter is not limited in these respects.

In some embodiments, the scanned beam display system 500 may be a component of a Near-Eye-Display device for implementing augmented reality (AR) technologies to generate composite views that include computer-generated images superimposed over a real-world view. In such embodiments, the display 508 may be a transparent display panel such as, for example, a waveguide display that includes one or more diffractive optical elements (DOEs) for in-coupling incident light into the waveguide, expanding the incident light in one or more directions for exit pupil expansion, and/or out-coupling the incident light out of the waveguide (e.g., toward a user's eye).

In the foregoing Summary and/or Detailed Description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail. Furthermore, the terms coupled and/or connected, along with their derivatives, may be used throughout this disclosure. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. One or more of "on," "overlying," and "over" may be used to indicate that two or more elements are in direct physical contact with each other. However, "on," "overlying," and/or "over" may also describe a locational relationship between two or more elements that are not in direct contact with each other. For example, "over" may mean that one element is above another element but not necessarily in direct contact with that other element (e.g., another element or elements may be in between the two elements).

Example Clauses

The disclosure presented herein may be considered in view of the following clauses.

Example Clause A, a microelectromechanical systems (MEMS) scanning device, comprising: a scanning mirror; a torsional beam flexure that mechanically suspends the scanning mirror from a frame structure, wherein the torsional beam flexure includes a first region having a first average width relative to a rotational axis and a second region having a second average width, that is greater than the first average width, relative to the rotational axis; a strain sensor that generates a feedback signal that is indicative of mechanical strain at a strain sensitive electrical circuit, wherein the strain sensitive electrical circuit is disposed relatively closer to the first region of the torsional beam flexure than the second region of the torsional beam flexure; and an actuator that, upon activation by a drive signal, causes a rotation of the scanning mirror about the rotational axis, wherein particular degrees of the rotation correspond to relatively higher mechanical strains being induced into the first region of the torsional beam flexure as compared to the second region of the torsional beam flexure.

Example Clause B, the MEMS scanning device of Example Clause A, wherein the second region of the torsional beam flexure includes a first beam element that extends longitudinal in relation to the rotational axis and a second beam element that extends longitudinal in relation to the rotational axis, and wherein the first beam element is physically separated from the second beam element to form a void therebetween.

Example Clause C, the MEMS scanning device of Example Clause B, wherein the void that is formed between the first beam element and the second beam element is coincident with the rotational axis about which the scanning mirror rotates.

Example Clause D, the MEMS scanning device of Example Clause B, wherein the void that is formed between the first beam element and the second beam element of the second region has a third width that is greater than the first width of the first region.

Example Clause E, the MEMS scanning device of any one of Example Clauses A through D, wherein the torsional beam flexure includes a flexible lever arm that extends, from the second region and transverse in relation to the rotational axis, to the actuator, and wherein the flexible lever arm converts a force applied by the actuator into a moment that causes the rotation of the scanning mirror about the rotational axis.

Example Clause F, the MEMS scanning device of Example Clause E, wherein the flexible lever arm that extends from the second region to the actuator includes an omega region that extends at least partially longitudinal in relation to the rotational axis.

Example Clause G, the MEMS scanning device of Example Clause E, wherein the flexible lever arm extends from a portion of the second region that is relatively closer to a void base, of a void that is formed between at least two beam elements of the second region, than to a void apex of the void.

Example Clause H, the MEMS scanning device of any one of Example Clauses A through G, wherein the first average width is less than fifty microns, and wherein the second average width is at least three times greater than the first average width.

Example Clause I, the MEMS scanning device of any one of Example Clauses A through H, wherein the strain sensitive electrical circuit is disposed within the first region of the torsional beam flexure.

Example Clause J, a scanning device, comprising: a torsional beam flexure that mechanically suspends a scanning mirror from a frame structure, wherein the torsional beam flexure includes a first region and a second region that are each disposed between the frame structure and the scanning mirror, and wherein the second region includes a void that is formed between a first beam element that extends longitudinal in relation to a rotational axis of the scanning mirror and a second beam element that extends longitudinal in relation to the rotational axis; a first actuator positioned on a first side of the rotational axis and coupled to a first lever arm that extends transverse from the second region, of the torsional beam flexure, that includes the void; a second actuator positioned on a second side of the rotational axis and coupled to a second lever arm that extends transverse from the second region, of the torsional beam flexure, that includes the void; and a strain sensor that generates a feedback signal that is indicative of mechanical strain at a strain sensitive electrical circuit, wherein the strain sensitive electrical circuit is disposed relatively closer to the frame structure than a void apex of the void.

Example Clause K, the scanning device of Example Clause J, wherein the first region has a first average width in relation to the rotational axis and the second region has a second average width in relation to the rotational axis, and wherein the first width is less than the second width.

Example Clause L, the scanning device of any one of Example Clauses J through K, wherein an inner profile of the void, that is formed between the first beam element and the second beam element, has a third average width in relation to the rotational axis, and wherein the third average width is greater than the first average width.

Example Clause M, the scanning device of any one of Example Clauses J through L, wherein the second average width of the second region is at least three times greater than the first average width of the first region.

Example Clause N, the scanning device of any one of Example Clauses J through M, wherein the first lever arm and the second lever arm extend from a portion of the second region that is closer to a void base than to a void apex.

Example Clause O, the scanning device of any one of Example Clauses J through N, wherein the strain sensitive electrical circuit is a bridge circuit that is disposed within the first region of the torsional beam flexure, and wherein the bridge circuit is relatively closer to a void apex than to a void base.

Example Clause P, the scanning device of any one of Example Clauses J through O, wherein activation of the first actuator and second actuator causes a rotation of the scanning mirror about the rotational axis, and wherein particular degrees of the rotation correspond to relatively higher mechanical strains being induced into the first region of the torsional beam flexure as compared to the second region of the torsional beam flexure that includes the void.

Example Clause Q, a torsional beam flexure for suspending a scanning mirror from a frame structure, the torsional beam flexure comprising: a first region having a first average width in relation to a rotational axis of the scanning mirror; a second region having a second average width, in relation to the rotational axis, that is greater than the first average width, the second region including a pair of beam element that form a void having a void apex and a void base; and at least two lever arms that extend transverse from a portion of the second region that is relatively closer to the void base than to the void apex, at least two lever arms convert forces applied by at least two actuators into moments that causes a rotation of the scanning mirror about the rotational axis.

Example Clause R, the torsional beam flexure of Example Clause Q, wherein the void has a third average width that is greater than the first average width.

Example Clause S, the torsional beam flexure of any one of Example Clauses Q through R, wherein the second average width is at least two times greater than the first average width.

Example Clause T, the torsional beam flexure of any one of Example Clauses Q through S, further comprising, a strain sensitive electrical circuit disposed within the first region.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:
1. A microelectromechanical systems (MEMS) scanning device, comprising:
  a scanning mirror;
  a torsional beam flexure that mechanically suspends the scanning mirror from a frame structure, wherein the torsional beam flexure includes a first region having a first average width relative to a rotational axis and a second region having a second average width, that is greater than the first average width, relative to the rotational axis, wherein:
    the second region of the torsional beam flexure includes a first beam element that extends longitudinal in relation to the rotational axis and a second beam element that extends longitudinal in relation to the rotational axis; and
    the first beam element is physically separated from the second beam element to form a void therebetween;
  a strain sensor that generates a feedback signal that is indicative of mechanical strain at a strain sensitive electrical circuit, wherein the strain sensitive electrical circuit is disposed within the first region of the torsional beam flexure; and
  an actuator that, upon activation by a drive signal, causes a rotation of the scanning mirror about the rotational axis, wherein particular degrees of the rotation correspond to relatively higher mechanical strains being induced into the first region of the torsional beam flexure as compared to the second region of the torsional beam flexure.

2. The MEMS scanning device of claim 1, wherein the void that is formed between the first beam element and the second beam element is coincident with the rotational axis about which the scanning mirror rotates.

3. The MEMS scanning device of claim 1, wherein the void that is formed between the first beam element and the second beam element of the second region has a third width that is greater than the first width of the first region.

4. The MEMS scanning device of claim 1, wherein the torsional beam flexure includes a flexible lever arm that extends, from the second region and transverse in relation to the rotational axis, to the actuator, and wherein the flexible lever arm converts a force applied by the actuator into a moment that causes the rotation of the scanning mirror about the rotational axis.

5. The MEMS scanning device of claim 4, wherein the flexible lever arm that extends from the second region to the actuator includes an omega region that extends at least partially longitudinal in relation to the rotational axis.

6. The MEMS scanning device of claim 4, wherein the flexible lever arm extends from a portion of the second region that is relatively closer to a void base, of a void that is formed between at least two beam elements of the second region, than to a void apex of the void.

7. The MEMS scanning device of claim 1, wherein the first average width is less than fifty microns, and wherein the second average width is at least three times greater than the first average width.

8. The MEMS scanning device of claim 1, wherein a width of the second region includes the void.

9. A scanning device, comprising:
a torsional beam flexure that mechanically suspends a scanning mirror from a frame structure, wherein:
the torsional beam flexure includes a first region and a second region that are each disposed between the frame structure and the scanning mirror;
the first region has a first average width relative to a rotational axis;
the second region has a second average width, that is greater than the first average width, relative to the rotational axis; and
the second region includes a void that is formed between a first beam element that extends longitudinal in relation to the rotational axis of the scanning mirror and a second beam element that extends longitudinal in relation to the rotational axis;
a first actuator positioned on a first side of the rotational axis and coupled to a first lever arm that extends transverse from the second region, of the torsional beam flexure, that includes the void;
a second actuator positioned on a second side of the rotational axis and coupled to a second lever arm that extends transverse from the second region, of the torsional beam flexure, that includes the void; and
a strain sensor that generates a feedback signal that is indicative of mechanical strain at a strain sensitive electrical circuit, wherein the strain sensitive electrical circuit is disposed within the first region.

10. The scanning device of claim 9, wherein an inner profile of the void, that is formed between the first beam element and the second beam element, has a third average width in relation to the rotational axis, and wherein the third average width is greater than the first average width.

11. The scanning device of claim 9, wherein the second average width of the second region is at least three times greater than the first average width of the first region.

12. The scanning device of claim 9, wherein the first lever arm and the second lever arm extend from a portion of the second region that is closer to a void base than to a void apex.

13. The scanning device of claim 9, wherein the strain sensitive electrical circuit is a bridge circuit that is disposed within the first region, and wherein the bridge circuit is relatively closer to a void apex than to a void base.

14. The scanning device of claim 9, wherein activation of the first actuator and the second actuator causes a rotation of the scanning mirror about the rotational axis, and wherein particular degrees of the rotation correspond to relatively higher mechanical strains being induced into the first region of the torsional beam flexure as compared to the second region of the torsional beam flexure that includes the void.

15. The scanning device of claim 9, wherein a width of the second region includes the void.

16. A torsional beam flexure for suspending a scanning mirror from a frame structure, the torsional beam flexure comprising:
a first region having a first average width in relation to a rotational axis of the scanning mirror;
a second region having a second average width, in relation to the rotational axis, that is greater than the first average width, the second region including a pair of beam elements that form a void having a void apex and a void base;
at least two lever arms that extend transverse from a portion of the second region that is relatively closer to the void base than to the void apex and that convert forces applied by at least two actuators into moments that causes a rotation of the scanning mirror about the rotational axis; and
a strain sensitive electrical circuit disposed within the first region.

17. The torsional beam flexure of claim 16, wherein the void has a third average width that is greater than the first average width.

18. The torsional beam flexure of claim 17, wherein the second average width is at least two times greater than the first average width.

19. The torsional beam flexure of claim 16, wherein a width of the second region includes the void.

* * * * *